United States Patent [19]

Parthasarathi et al.

[11] Patent Number: 5,449,951
[45] Date of Patent: Sep. 12, 1995

[54] LEAD FRAMES WITH IMPROVED ADHESION TO A POLYMER

[75] Inventors: Arvind Parthasarathi, North Branford; Deepak Mahulikar, Madison, both of Conn.

[73] Assignee: Olin Corporation, New Haven, Conn.

[21] Appl. No.: 270,064

[22] Filed: Jul. 1, 1994

Related U.S. Application Data

[60] Division of Ser. No. 1,014, Jan. 6, 1993, Pat. No. 5,343,073, which is a continuation-in-part of Ser. No. 822,373, Jan. 17, 1992.

[51] Int. Cl.$^6$ .................. H01L 23/043; H01L 23/48; H01L 23/54
[52] U.S. Cl. ...................... 257/677; 257/766; 257/666; 257/736
[58] Field of Search ............ 257/736, 666, 766, 667, 257/677, 735

[56] References Cited

U.S. PATENT DOCUMENTS

| | | | |
|---|---|---|---|
| 3,677,828 | 7/1972 | Caule | 148/6.15 R |
| 3,716,427 | 2/1973 | Caule | 156/3 |
| 3,764,400 | 10/1973 | Caule | 148/6.15 |
| 3,833,433 | 9/1974 | Caule | 156/5 |
| 4,131,517 | 12/1978 | Mitsumo | 205/152 |
| 4,387,006 | 6/1983 | Kajiwara et al. | 205/112 |
| 4,428,987 | 1/1984 | Bell et al. | 205/198 |
| 4,521,469 | 6/1985 | Butt et al. | 428/76 |
| 4,647,315 | 3/1987 | Parthasarathi et al. | 148/258 |
| 4,707,724 | 11/1987 | Suzuki et al. | 257/677 |
| 4,835,067 | 5/1989 | Levine | 257/701 |
| 4,862,246 | 8/1989 | Masuda et al. | 257/667 |
| 4,888,449 | 12/1989 | Crane et al. | 29/827 |
| 4,939,316 | 7/1990 | Mahulikar et al. | 29/827 |
| 4,970,569 | 11/1990 | Mori et al. | 257/768 |
| 5,001,546 | 3/1991 | Butt | 257/666 |
| 5,022,968 | 6/1991 | Lin et al. | 205/141 |
| 5,060,052 | 10/1991 | Casto et al. | 257/723 |
| 5,098,796 | 3/1992 | Lin et al. | 428/607 |
| 5,221,859 | 6/1993 | Kobayashi et al. | 257/677 |
| 5,329,158 | 7/1994 | Lin | 257/736 |

FOREIGN PATENT DOCUMENTS

| | | | |
|---|---|---|---|
| 087695 | 7/1981 | Japan . | |
| 0030353 | 2/1982 | Japan | 257/736 |
| 218863 | 11/1985 | Japan . | |
| 239353 | 10/1991 | Japan . | |
| 0283556 | 12/1991 | Japan | 257/736 |

*Primary Examiner*—Robert P. Limanek
*Assistant Examiner*—Alexander Oscar Williams
*Attorney, Agent, or Firm*—Gregory S. Rosenblatt

[57] ABSTRACT

There is provided a lead frame with enhanced adhesion to a polymer resin. The lead frame is coated with a thin layer of containing chromium, zinc or a mixture of chromium and zinc. A mixture of chromium and zinc with the zinc-to-chromium ratio in excess of about 4:1 is most preferred. The coated lead frames exhibit improved adhesion to a polymeric resin.

8 Claims, 3 Drawing Sheets

LEAD FRAMES WITH IMPROVED ADHESION TO A POLYMER

CROSS REFERENCE TO RELATED APPLICATION

This application is a division of U.S. patent application Ser. No. 08/001,014, filed Jan. 6, 1993, now U.S. Pat. No. 5,343,073 which in turn is a continuation in part of U.S. patent application Ser. No. 07/822,373 entitled "Lead Frames with Improved Adhesion to a Polymer" by Arvind Parthasarathi et al, filed Jan. 17, 1992.

FIELD OF THE INVENTION

This invention relates generally to lead frames for electronic packages. More particularly, the invention relates to enhancing the bond between a lead frame and polymer adhesive by depositing a coating layer containing chromium and zinc.

BACKGROUND OF THE INVENTION

One type of package used to house microelectronic devices, such as silicon based integrated circuits, is a molded plastic package. The package is low cost, easy to assemble and provides adequate protection of the device from water vapor and other contaminants. During assembly, a device is mounted on a die attach paddle and electrically interconnected to the lead frame. The die attach paddle, electronic device and inner portion of the lead frame are then encapsulated in a molding resin such as by transfer molding. The resin forms a hard, relatively moisture impervious shell to protect both the device and electrical connections.

After encapsulation, the outer leads of the lead frame may be soldered to a printed circuit board or other external device. The temperature of the package during soldering may rise to around 260° C. Any water vapor trapped within the package will convert to steam and expand. One site for the accumulation of water is under the die attach paddle. When the accumulated water expands, the base of the molded plastic package deforms, leading to what is known as the "pop corn effect".

Moisture also penetrates the plastic package along the interface between the leads and molding resin. The adhesion between the resin and leads is primarily mechanical in nature and a gap may exist between the leads and encapsulation. Moisture travels through the gap, accumulating at the die attach paddle.

Various mechanisms to improve the bond between the lead frame and molding resin have been proposed. For example, U.S. Pat. No. 4,862,246 to Masuda et al discloses forming a series of hemispherical depressions in the die attach paddle to increase the adhesion of the paddle to the molding resin.

A layer of dull nickel applied to a lead frame has been found to enhance the epoxy bond as disclosed in U.S. Pat. No. 4,888,449 to Crane et al. The Crane et al patent also discloses coating metallic package components with a metal or metal alloy selected from the group consisting of nickel, tin, cobalt, chromium, molybdenum, tungsten, titanium, zirconium, hafnium, niobium, tantalum, germanium, aluminum and alloys of the foregoing metals. The Crane et al patent is incorporated in its entirety herein.

Another patent which discloses a metallic coating to improve the adhesion between a metallic lead frame and a polymer resin is U.S. Pat. No. 4,707,724 to Suzuki et al. The Suzuki et al patent discloses coating a die attach paddle with an alloy of tin/nickel or iron/nickel.

Non-metallic coatings have also been disclosed. For example, U.S. Pat. No. 4,428,987 to Bell et al discloses pretreating a copper surface to improve adhesion. The surface is electrolytically reduced and then coated with a benzotriazole solution.

U.S. Pat. No. 5,122,858 to Mahulikar et al discloses that coating a lead frame with a thin polymeric layer improves the adhesion between the lead frame and molding resin. U.S. Pat. No. 5,122,858 is incorporated in its entirety herein.

Molded plastic packages have a monolithic body. Other electronic packages are formed from discrete base and cover components. One such package is disclosed in U.S. Pat. No. 4,939,316 to Mahulikar et al. The package has anodized aluminum base and cover components with a lead frame disposed therebetween. A polymer adhesive bonds the lead frame to both the base and cover. Other packages having discrete bases and covers have copper, copper alloy or plastic components. Each of these packages could be improved if the adhesion between the metallic lead frame and the polymer resin is improved.

SUMMARY OF THE INVENTION

Accordingly, it is an object of the invention to provide a metallic lead frame with enhanced adhesion to a polymer resin. It is a feature of the invention that while the lead frame may be coated with a plurality of layers, the outer most layer is either chromium, zinc or a mixture thereof with the mixture being most preferred. This layer is deposited by any suitable method such as electrolytic or by immersion. The zinc and chromium may be codeposited or sequentially deposited.

Among the advantages of the enhanced lead frame of the invention are the moisture penetration resistance of both monolithic molded packages and discrete adhesively sealed packages are improved. The outer most coating layer resists tarnishing during package assembly. The polymer to metal bond is stronger than that of a polymer to uncoated copper, copper coated with copper oxide or copper coated with nickel. The zinc to chromium ratio of the coating is preferably in excess of about 4:1. The preferred coating is easily removed in dilute hydrochloric or sulfuric acid and is also wire bondable.

In accordance with the invention, there is provided a lead frame having a conductive metal substrate formed into a plurality of leads and coated with at least one metallic layer. The outer most metallic layer contains chromium, zinc or a mixture thereof.

A process for the manufacture of an electronic package is also provided. The process steps include forming a lead frame having a plurality of inner and outer leads, coating the lead frame with at least one metallic layer. The outer most metallic layer contains chromium, zinc or a mixture thereof. The inner leads are then electrically interconnected to an electronic device. Depending on the package type, a polymer resin is then molded about the electronic device and inner leads or, alternatively, the lead frame is disposed between base and cover components and adhesively bonded to both.

The objects, features and advantages discussed above will become more apparent from the specification and drawings which follow.

DETAILED DESCRIPTION OF THE INVENTION

Figure 1:
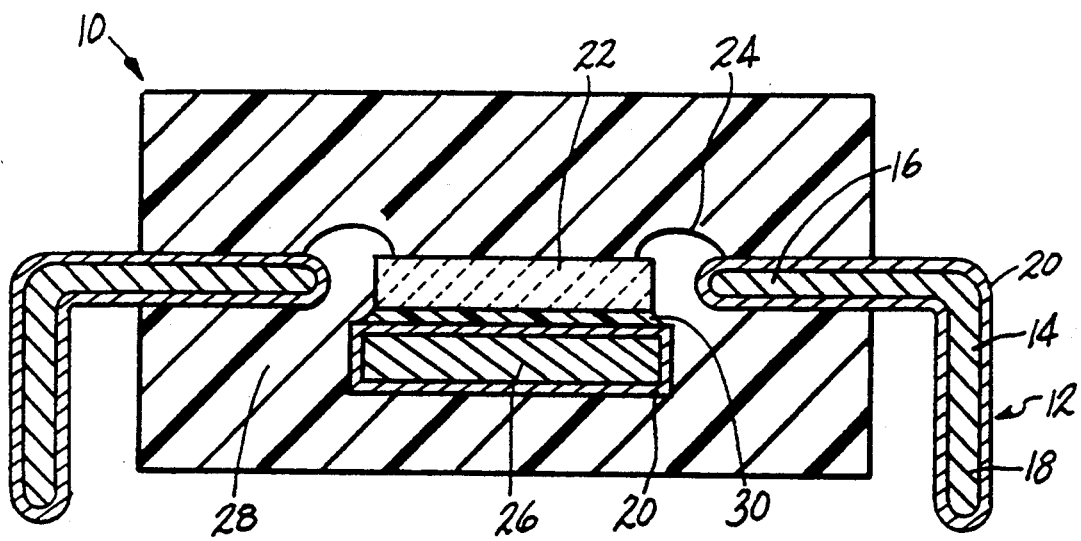
FIG. 1 shows in cross-sectional representation a molded plastic package incorporating the lead frame of the invention.

In accordance with the invention, a lead frame is coated with at least one metallic layer to improve adhesion to a polymer resin. The lead frame is formed from any electrically conductive metal substrate. Copper base alloys are preferred. The copper alloys have high electrical conductivity to transfer signal to and from an encapsulated electronic device. The copper alloys also have high thermal conductivity to remove heat generated by the device during operation.

Suitable copper alloys for mature electronic devices such as plastic dual in line packages (PDIP), plastic leaded chip carriers (PLCC), small outline integrated circuits (SOIC) and discrete device packages are characterized by moderate strength and moderate to high electrical conductivity. Generally, the yield strength of the alloys is in the range of 345 MPa (50 ksi) to 485 MPa (70 ksi) and the electrical conductivity is above about 30% IACS. IACS refers to the International Annealed Copper Standard where pure copper has a value of 100%.

An exemplary list of copper alloys utilized as lead frames for mature devices follows. All percentages are weight percent unless otherwise indicated. Five digit alloy designations preceded by the letter "C" refer to the UNS (Unified Numbering System) designation for the alloy as endorsed by the Copper Development Association and the American Society of Metals.

C15100, manufactured by Olin Corporation, Stamford, Conn. with the composition, 0.05%–0.15% zirconium and the balance copper. The nominal composition is 99.9% copper and 0.1% zirconium.

C19400, manufactured by Olin Corporation, Stamford, Conn. with the composition 2.1%–2.6% iron, 0.015%–0.15% phosphorous, 0.05%–0.20% zinc and the balance copper. The nominal composition is 97.5% copper, 2.35% iron, 0.3% phosphorous and 0.12% zinc.

C19500, manufactured by Olin Corporation, Stamford, Conn. with the composition 1.0%–2.0% iron, 0.01%–0.35% phosphorous, 0.30%–1.3% cobalt, 0.10%–1.0% tin and the balance copper. The nominal composition is 97% copper, 1.5% iron, 0.1% phosphorous, 0.8% cobalt and 0.6% tin.

C19700, manufactured by Olin Corporation, Stamford, Conn., having the composition 0.30%–1.2% iron, 0.10%–0.40% phosphorous, 0.01%–0.20% magnesium and the balance copper. The nominal composition is 99% copper, 0.6% iron, 0.2% phosphorous and 0.05% magnesium.

C50710, manufactured by Mitsubishi Electric Corporation, Tokyo, Japan, having the composition 1.7%–2.3% tin, 0.1%–0.4% nickel, up to 0.15% phosphorous and the balance copper.

C19210, manufactured by Kobe Steel Ltd, Tokyo, Japan, having the composition 0.05%–0.15% iron, 0.025%–0.040% phosphorous and the balance copper.

C19520, manufactured by Mitsubishi Shindoh Company, Ltd, Tokyo, Japan, having the composition 0.5%–1.5% iron, 0.5%–1.5% tin, 0.01%–0.35% phosphorous and the balance copper.

C18070, manufactured by Wieland Werke, Ulm, Germany, having the composition 0.15%–0.40% chromium, 0.01%–0.40% titanium, 0.02%–0.07% silicon and the balance copper.

C19010, manufactured by Poong San Metal Corporation, Incheon, Korea having the composition 0.8%–1.8% nickel, 0.15%–0.35% silicon, 0.01%–0.05% phosphorous and the balance copper.

More recently developed electronic packages include thin packages such as thin small outline packages (TSOP) and thin quad flat packs (TQFP). The thin packages have a thickness of less than about 2 millimeters and are typically on the order of 1.0 to 1.3 millimeters thick. Other recently developed packages include the quad flat pack (QFP) and molded carrier ring package (MCR), such as TapePak® packages. TapePak is a trademark of National Semiconductor Corporation of Santa Clara, Calif.

The requirements of the lead frames for the recently developed packages include a thickness under about 0.2 mm (0.008 inch) and typically on the order of 0.13mm–15 mm (0.005–0.006 inch). The yield strength is greater than about 485 MPa (70 ksi) with moderate (greater than 30% IACS electrical conductivity).

In addition to C19400 and C19700, described above, illustrative lead frame alloys for these packages include the following.

C70250, manufactured by Olin Corporation, Stamford, Conn., having the composition 2%–4.8% nickel, 0.2%–1.4% silicon, 0.05%–0.45% magnesium and the balance copper. The nominal composition is 96.2% copper, 3.0% nickel, 0.65% silicon, and 0.15% magnesium.

EFTEC-64T, manufactured by Furukawa Electric Company Ltd, Tokyo, Japan, having the approximate composition 0.30%–0.40% chromium, 0.20%–0.30% tin, 0.15%–0.25% zinc and the balance copper.

KLF-125, manufactured by Kobe Steel, having the approximate composition 2.7%–3.7% nickel, 0.2%–1.2% silicon, 0.1%–0.5% zinc and the balance copper.

MF224, manufactured by Mitsubishi Electric, having the composition 1.9%–2.9% nickel, 0.20%–0.60% silicon, 0.10%–0.20% phosphorous and the balance copper.

The lead frame may also comprise an electrically conductive iron based coated with a or nickel based alloy substrate formed into a plurality of leads chromium-zinc layer that is also improved in accordance with the invention. These lead frames include Kovar (trademark for an alloy having 54% by weight Fe, 29% Ni and 17% Co) and Alloy 42 (42% by weight Ni, balance Fe).

Polymer resins used in electronic package assembly tend to have a relatively high coefficient of thermal expansion. The package components are usually manufactured from copper or aluminum based alloys, also having a high coefficient of thermal expansion. To minimize stresses generated by coefficient of thermal expansion mismatch, the lead frames are preferably also formed from a copper or copper alloy substrate. With relatively high electrical conductivity and resistance to thermally induced softening, copper alloy C7025 is a preferred lead frame material.

A metallic substrate is provided with a thickness of from about 0.005 inches to about 0.020 inches. More preferably, the thickness is from about 0.010 inches to about 0.015 inches for lead frames intended for dual-in line packages where the leads approach the package body from two sides. The preferred thickness for lead frames intended for quad packages where leads approach the package from four sides is from about 0.005 inches to about 0.010 inches. The substrate is formed into a lead frame by any conventional process such as stamping or etching.

The lead frame is next coated with at least one metallic layer. While the outer most layer contains chromium, zinc or a mixture thereof as described below, intermediate layers may be nickel to prevent diffusion of subsequently layers into the metallic substrate. Silver or aluminum layers may be present to improve the strength of wire bonds.

The outer most layer contains chromium, zinc or a mixture thereof. Most preferred is a mixture of chromium and zinc. The outer most layer is thin, on the order of from about 10 to about 1000 angstroms. More preferably, the thickness is from about 10 to about 100 angstroms and most preferably, from about 40 to about 80 angstroms. The outer most coating layer provides oxidation resistance and improves adhesion to a polymer resin without significantly reducing the strength of a wire bond or detrimentally affecting subsequent assembly operations. The outer most layer may be applied by any suitable technique such as immersion plating, electrolytic plating or cladding.

The preferred coating contains both chromium and zinc. This coating may be deposited by any conventional method and may be a codeposited layer or sequentially deposited layers of chromium and zinc. One preferred method of depositing the coating is disclosed in U.S. Pat. No. 5,022,968 to Lin et al which is incorporated herein by reference in its entirety. The patent discloses a coating layer containing chromium and zinc for anti-tarnish purposes. The coating layer is electrolytically deposited from a basic aqueous electrolyte containing hydroxide ions, from about 0.07 grams per liter to about 7 g/l zinc ions and from about 0.1 g/l to about 100 g/l of a water soluble hexavalent chromium salt where the concentration of either the zinc ions or the chromium (VI) ions or both is less than 1.0 g/l. The coating layer has a zinc-to-chromium ratio in excess of about 4:1. One analyzed sample had the composition: 5 atomic percent Cr, 21% Zn, 56% O, 16% C and 1% Cu.

A lead frame having an outer most metallic layer containing chromium, zinc or a mixture thereof provides an enhanced electronic package. FIG. 1 illustrates in cross-sectional representation, a molded plastic package 10 incorporating the enhanced lead frame 12 of the invention. The enhanced lead frame 12 has an electrically conductive metal substrate 14 formed into a plurality of inner leads 16 and outer leads 18. The electrically conductive metal substrate 14 has a thickness of from about 0.005 inches to about 0.020 inches and more typically, from about 0.010 inches to about 0.015 inches.

There may be a plurality of metallic layers coating the electrically conductive metal substrate 14. The outer most layer 20 (which is not drawn to scale in the Figure) contains chromium, zinc or a mixture thereof. Most preferably, the outer most layer 20 is a codeposited layer having a mixture of chromium and zinc with a zinc to chromium ratio in excess of about 4:1.

An electronic device 22 is electrically interconnected to the enhanced lead frame 12 by a suitable means such as bond wires 24 or tape automated bonding (TAB) beam leads. Bond wires 24 are attached to inner leads 16 by thermocompression or thermosonic bonding. Wire bonding may be to the outer most layer 20, to an interior coating layer or to the substrate. The outer most coating layer 20 may be omitted from the inner leads 16 either by masking the inner leads during deposition of the coating layer or by subsequent removal. When the preferred zinc to chromium ratio of in excess of about 4:1 is employed, removal is facilitated. The outer most coating layer is readily removed by immersion in dilute hydrochloric or sulfuric acid.

The Applicants have established (as shown in Example 1 below) that the bond strength of a wire bond to a lead frame coated in accordance with the present invention is not significantly less than the bond formed to a conventional silver plated lead frame.

The electronic device in a molded plastic package is typically supported by a centrally positioned die attach pad 26 formed from the same material as the electrically conductive metal substrate 14. Because moisture accumulates between the die attach pad 26 and molding resin 28, it is preferred that the die attach pad 26 is also coated with an outer most layer 20 containing chromium, zinc or a mixture thereof.

The electronic device 22 is bonded to the die attach pad 26 by a die attach material 30 which may be either a polymer adhesive or a solder. While the outer most layer 20 will enhance the bond of a polymeric die attach adhesive 30, if a metallic solder die attach adhesive is used, the outer most layer 20 may be omitted from that surface in contact with the electronic device 22. The outer most layer may be omitted either by masking during deposition or subsequent etching in dilute hydrochloric or dilute sulfuric acid.

Once the electronic device 22 is bonded to a die attach pad 26 and electrically interconnected to the enhanced lead frame 12 through bond wires 24, the assembly is encapsulated in a molding resin. A polymer resin is molded about the electronic device 22 and inner leads 16. Any suitable molding resin may be used such as Nitto 180B, manufactured by Nitto Denko Corporation of Osako, Japan.

Figure 2:
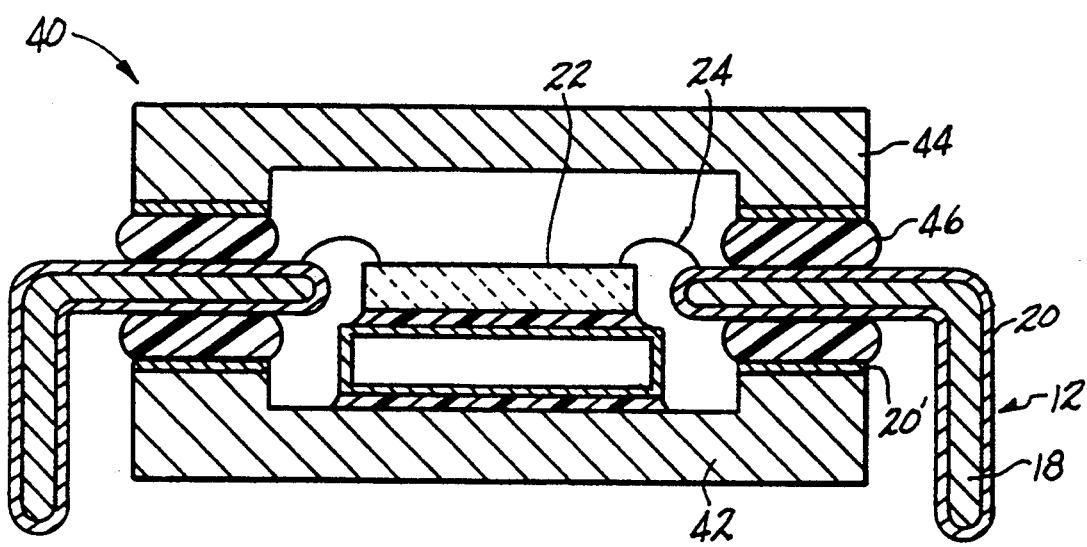
FIG. 2 shows in cross-sectional representation an electronic package having separate base and cover components incorporating the lead frame of the invention.

A second type of electronic package is illustrated in FIG. 2. The package 40 has discrete base 42 and cover 44 components. An enhanced lead frame 12 as described above is disposed between the base 42 and cover 44. The base 42 and cover 44 may be formed from any suitable material, either a metal, polymer or ceramic. Typically, both the base 42 and cover 44 are manufactured from the same material to avoid stresses from a mismatch in coefficient of thermal expansion. Most preferred for the base 42 and cover 44 are copper and copper alloys, aluminum and aluminum alloys and polymers. To facilitate the removal of heat from the electronic device 22, the base component 42 is preferably either a copper alloy or an aluminum alloy. As disclosed in U.S. Pat. No. 4,939,316, when the base 42 and cover 44 are an aluminum alloy, the bond to a polymer resin 46 may be improved by forming an anodization layer as the outer most layer 20'. When the base and cover components are copper or a copper alloy, the outer most layer 20' is preferably the chromium, zinc or mixture of chromium zinc coating of the invention.

The enhanced lead frame 12 is disposed between discrete base 42 and cover 44 components and adhesively bonded to both by a polymer adhesive 46 such as Hysol XEA9684NM manufactured by The Dexter Company of Pittsburg, Calif. The outer most layer 20 of the enhanced lead frame 12 improves adhesion to the polymer resin reducing the ingress of moisture along the lead frame/polymer interface. A further improvement in adhesion is obtained by depositing an outer most layer 20' on those surfaces of the base component 42 and cover component 44 which contact the polymer resin 46.

Generally, after assembly of an electronic package, the outer lead tips 18 are solder coated. The outer most layer 20 readily dissolves in dilute hydrochloric or sulfuric acid and is rapidly removed during the activation steps for electrolytic deposition of a solder layer. Immersion coating and hot dipping are similarly not affected by the presence of the outer most layer 20.

While the mechanism by which the outer most layer 20 improves adhesion of a lead frame to a polymer resin is not fully understood, Applicants believe a portion of the improvement originates from the anti-tarnish characteristics of the layer. During assembly of an electronic package, the lead frame is exposed to elevated temperatures. Bonding the electronic device to the die attach pad exposes the lead frame to a temperature of about 280° C. Wire bonding exposes the inner leads to a temperature of about 175° C. Polymer encapsulation or polymer sealing of a base and cover component exposes the lead frame and the die attach paddle to a temperature of about 190° C. Tinning or solder dipping exposes the outer leads to a temperature of about 260° C. Each elevated temperature excursion promotes the formation of copper oxide. Copper oxide does not adhere well to metallic copper. Failure of the bond between the lead frame and polymer adhesive is believed to occur between copper oxide and the metallic copper substrate. Deposition of a coating layer as described above inhibits the formation of copper oxide and permits direct contact between the polymer adhesive and the metallic substrate.

Figure 3:
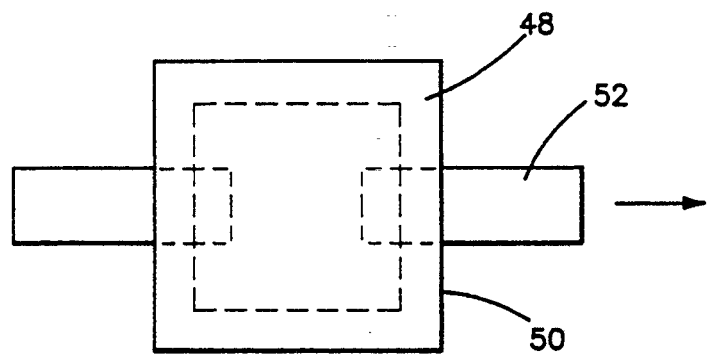
FIG. 3 shows in top planar view an assembly for evaluating adhesion.

However, for reasons not fully understood, adhesion of a lead frame having the outer most coating of the invention is superior to adhesion of a lead frame having other metallic coatings such as nickel. The improvement was determined using of the test apparatus illustrated in FIG. 3. FIG. 3 shows a metallic cover component 48 having an epoxy ring 50 (shown in phantom) bonded thereto. A test strip 52, 0.006 inches thick by 0.25 inches wide, simulated a plurality of leads. A mating base component with similarly attached epoxy ring was bonded to the opposite side of the test strip 52. Prior to assembly of the test structure, the test strip 52 was subjected to elevated temperature in air to simulate chip attach and wire bonding. The test strip 52 was then bonded between the base component and cover component and sealed to the epoxy adhesive 48.

The package body 48 was grasped in a suitable testing device such a tensile test machine manufactured by Instron, Canton, Mass. The test strip 52 was pulled from the test body in a generally parallel direction as indicated by the arrow. The shear stress required to remove the test strip 52 provided an indication of the strength of the adhesive bond. As shown in Examples 2 through 4, coatings of the present invention provide an improved bond as compared to other metallic coatings, oxide coatings or bare metallic substrate. While Example 1 shows the coating is wire bondable.

The following Examples are intended to be illustrative and no way limit the scope of the invention.

EXAMPLE 1

Four copper alloy C7025 test coupons having a thickness of about 0.006 inches were plated with about 200–400 microinches of silver for evaluating wire bond strengths. Two coupons were then electrolytically coated with a chromium zinc outer most layer. One Cr—Zn coated coupon and one coupon without the Cr—Zn outer most layer were heated to 175° C. for 2 hours in air to simulate adhesive die attach. Gold bond wires 0.001 inches in diameter were then bonded to all four coupons by thermocompression bonding. The force necessary to pull the wire from the substrate was then measured using a wire pull tester.

As shown in Table 1, Cr—Zn outermost layer did not significantly reduce the strength of the wire bond.

TABLE 1

| Coupon | Pull strength |
| --- | --- |
| C7025/Ag | 9.5 grams |
| C7025/Ag/Cr—Zn | 9.3–9.6 grams |
| C7025/Ag/heated to 175° C. | 8.7 grams |
| C7025/Ag/Cr—Zn/heated to 175° C. | 7.7–8.2 grams |

EXAMPLE 2

Eight copper alloy C7025 coupons 0.375" wide by 0.010 inches thick were separated into two groups. Four coupons were coated with the chromium-zinc containing coating while the other four remained uncoated. Two coated coupons and two uncoated coupons were then heated to simulate assembly. The thermal profile was 175° C. in air for two hours to simulate die attach followed by 250° C. in air for three minutes to simulate wire bonding. The coupons were then encapsulated in Nitto 150SG molding resin and the pull strength necessary to remove the coupon measured. As shown in Table 2, increase adhesion to the molding resin was obtained with the outer most coating of the invention.

TABLE 2

| Coupon | Pull Strength |
| --- | --- |
| C7025 | 1013 grams |
| C7025/Cr—Zn | 1400 grams |
| C7025/heat treated | 791 grams |
| C7025/Cr—Zn/heat treated | 1212 grams |

The remaining four coupons were placed in a pressure cooker for 96 hours at 121° C. and 100% relative humidity after encapsulation in the molding resin. The outer most coating of the invention again produced superior adhesion as shown in Table 3.

TABLE 3

| Coupon | Pull Strength |
| --- | --- |
| C7025 | 220 grams |
| C7025/Cr—Zn | 850 grams |
| C7025/heat treated | 269 grams |
| C7025/Cr—Zn/heat treated | 561 grams |

EXAMPLE 3

Test packages as illustrated in FIG. 3, were manufactured using Hysol XEA9485NM adhesive, anodized aluminum base and cover components and C7025 test strips.

Figure 4:
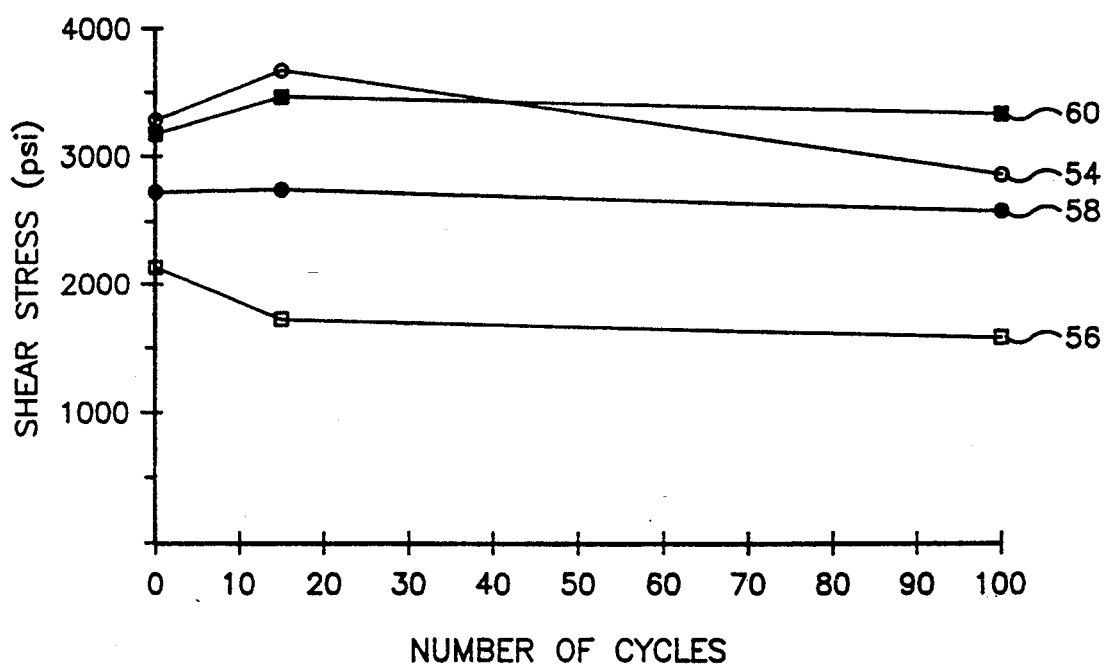
FIG. 4 shows in graphical representation, the shear stress as a function of thermal shock cycles
Figure 5:
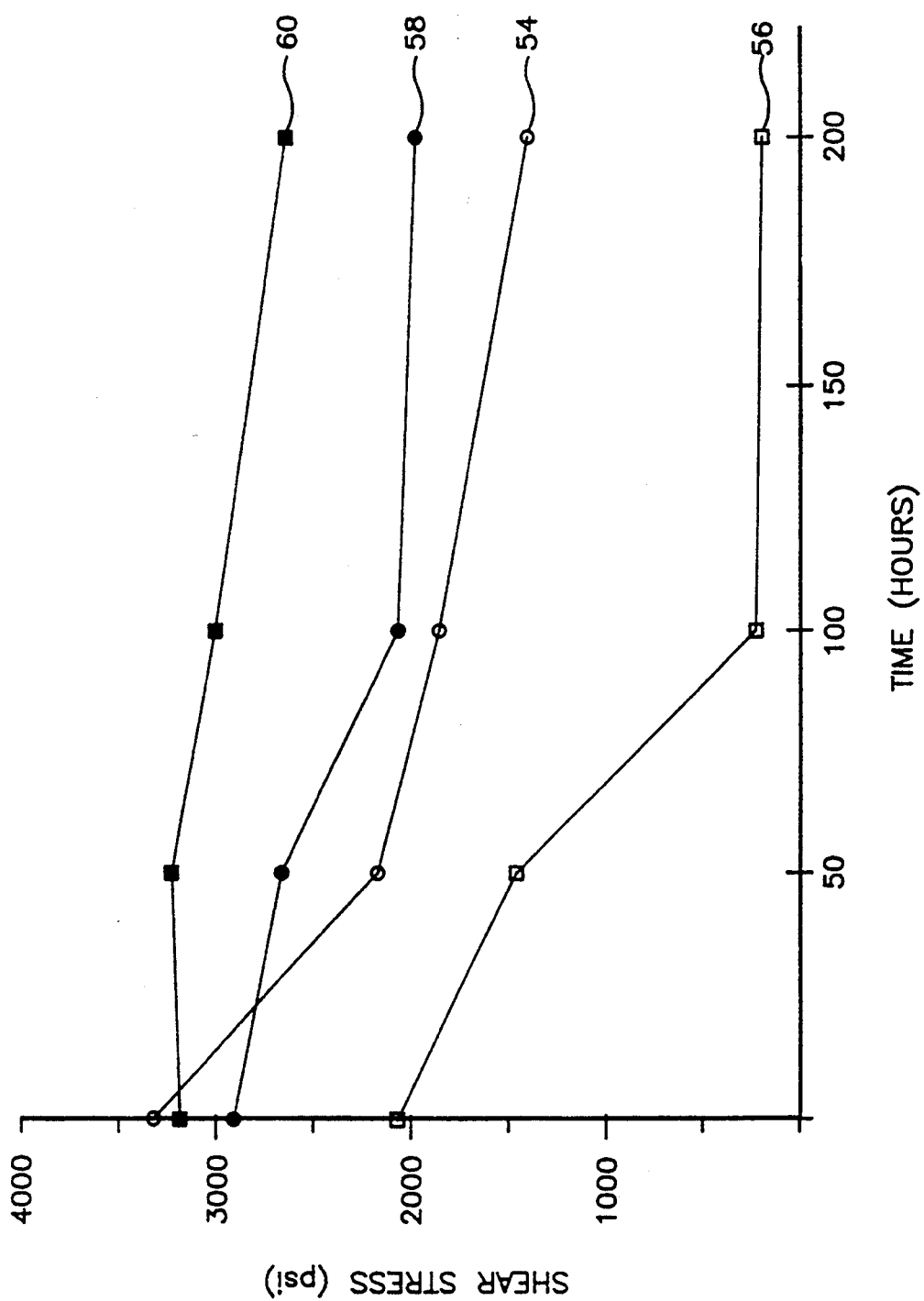
FIG. 5 shows graphical representation, the shear stress as a function number of hours in a pressure cooker.

A first coupon identified in FIG. 4 as reference numeral 54 was a C7025 coupon without any additional coating layers.

Reference numeral 56 illustrates a second coupon having a copper oxide outer most layer.

Reference numeral 58 illustrates a coupon having a nickel surface electrolytically deposited from a sulfamate nickel bath outer most layer.

Reference numeral 60 indicates a coupon coated with a zinc:chromium mixture having a zinc-to-chromium ratio in excess of about 4:1 outer most layer.

The initial shear stress was greatest for the uncoated C7025 coupon 54 with the zinc:chromium codeposited layer 60 having a slightly lower shear stress. Coupons having an outer most nickel layer 58 or oxidized copper 60 had considerably lower initial shear stresses.

Test samples were then subjected to thermal shock by immersion in an inert liquid at 150° C. for 5 minutes and then in a second inert liquid at −65° C. The cycle was repeated both 15 times and 100 times. As illustrated in FIG. 4, the shear strength of the C7025 coupon 54 which was not coated began to decrease after about 15 cycles. There was essentially no change in the C7025 coupon 60 coated with the zinc:chromium layer.

At 100 cycles, the Cr—Zn coated substrate 60 had a considerably higher shear strength than any of the other samples.

EXAMPLE 4

Test coupons were prepared as in Example 3. The test coupons were immersed in a pressure cooker at 121° C. and 15 psig at 100% relative humidity for 100 hours and 200 hours.

The uncoated coupon 54, nickel coated coupon 58 and oxide coated coupon 56 all exhibited a significant decrease in shear stress at both 100 and 200 hours. The zinc:chromium coated substrate 60 did not exhibit a significant decrease in shear stress.

While the invention has been described in terms of improving the adhesion between a lead frame and polymer resin, it is believed that deposition of an outermost coating as described above will improve the adhesion of any metallic substrate to a polymer resin. Intended applications are not limited to the assembly of electronic packages.

The patents disclosed hereinabove are intended to be incorporated by reference in their entireties.

It is apparent that there has been provided in accordance with the invention, a lead frame having enhanced adhesion to a polymer resin which fully satisfies the objects, features and advantages set forth herein above. While the invention has been described in combination with specific embodiments, it is evident that many alternatives, modifications and variations will be apparent to those skilled in the art; in light of the foregoing description. Accordingly, it is intended to embrace all such alternatives, modifications and variations as fall within the spirit and broad scope of the appended claims.

We claim:

1. A leadframe, comprising:
   an electrically conductive iron based alloy substrate formed into a plurality of leads, said substrate coated with a dilute sulfuric acid soluble metallic layer having a thickness of from about 10 angstroms to about 1000 angstroms and containing a mixture of chromium and zinc.

2. The lead frame of claim 1 wherein said electrically conductive metal substrate contains 54% by weight Fe, 29% Ni and 17% Co.

3. The lead frame of claim 1 wherein said electrically conductive metal substrate contains 42% by weight Ni, balance Fe.

4. A leadframe, comprising:
   an electrically conductive nickel based alloy substrate formed into a plurality of leads, said substrate coated with a dilute sulfuric acid soluble metallic layer having a thickness of from about 10 angstroms to about 1000 angstroms and containing a mixture of chromium and zinc.

5. The leadframe of claim 1 wherein the portion of said leads used for wire bonding is substantially free of said metallic layer.

6. The leadframe of claim 4 wherein the portion of said leads used for wire bonding is substantially free of said metallic layer.

7. The leadframe of claim 1 wherein said metallic layer has a thickness of from about 10 angstroms to about 100 angstroms.

8. The leadframe of claim 4 wherein said metallic layer has a thickness of from about 10 angstroms to about 100 angstroms.

* * * * *